US010096671B2

(12) United States Patent
Oh et al.

(10) Patent No.: US 10,096,671 B2
(45) Date of Patent: Oct. 9, 2018

(54) ORGANIC LIGHT EMITTING DISPLAY DEVICE AND METHOD FOR MANUFACTURING SAME

(71) Applicant: SAMSUNG DISPLAY CO., LTD., Yongin-si, Gyeonggi-do (KR)

(72) Inventors: Eonseok Oh, Seongnam-si (KR); Sangyeol Kim, Hwaseong-si (KR); Seil Kim, Hwaseong-si (KR); Woosik Jeon, Hwaseong-si (KR); Bomi Choi, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/499,042

(22) Filed: Apr. 27, 2017

(65) Prior Publication Data
US 2018/0006106 A1    Jan. 4, 2018

(30) Foreign Application Priority Data

Jul. 4, 2016    (KR) .......................... 10-2016-0084377

(51) Int. Cl.
*H01L 21/00* (2006.01)
*H01L 51/40* (2006.01)
(Continued)

(52) U.S. Cl.
CPC ........ *H01L 27/3279* (2013.01); *H01L 27/322* (2013.01); *H01L 27/3262* (2013.01);
(Continued)

(58) Field of Classification Search
CPC . H01L 51/50; H01L 51/5032; H01L 51/5068; H01L 51/5271; H01L 51/56;
(Continued)

(56) References Cited

U.S. PATENT DOCUMENTS 8,362,487 B2*    1/2013  Yamazaki ........... H01L 51/5259
                                                    257/59
9,530,980 B2*   12/2016  Oh ....................... H01L 51/5228
(Continued)

FOREIGN PATENT DOCUMENTS

JP    2015-049962 A    3/2015
KR    10-1490303 B1    1/2015
KR    10-1560272 B1   10/2015

OTHER PUBLICATIONS

Kim, et al. "Effect of Film Thickness on the Properties of Indium Tin Oxide Thin Films" Journal of Applied Physics vol. 88, No. 10 (2000) pp. 6021-6026.

(Continued)

*Primary Examiner* — Hsien Ming Lee
(74) *Attorney, Agent, or Firm* — Lee & Morse, P.C.

(57) ABSTRACT

An organic light emitting device includes a base substrate having a pixel region and a non-pixel region, an organic light emitting element on the pixel region, and an auxiliary line in the non-pixel region. The organic light emitting element includes an anode, a first organic light emitting layer disposed on the anode, a first cathode, and a second cathode. The first cathode is on the first organic light emitting layer to be thereby electrically connected to the auxiliary line. The second cathode is on the first cathode to be thereby electrically connected to the first cathode. The first cathode may include a metal and the second cathode may include a transparent conductive oxide (TCO).

20 Claims, 16 Drawing Sheets

(52) U.S. Cl.
CPC ...... *H01L 27/3265* (2013.01); *H01L 51/0018* (2013.01); *H01L 51/5228* (2013.01); *H01L 2227/323* (2013.01)

(58) Field of Classification Search
CPC ............... H01L 51/504; H01L 51/5218; H01L 51/5228; H01L 2924/12044; H01L 27/32; G02B 6/007
USPC ...... 438/82, 99; 313/499–509; 428/690, 917
See application file for complete search history.

(56) References Cited

U.S. PATENT DOCUMENTS 9,871,090 B2 * 1/2018 Lee ..................... H01L 27/3276

2014/0312323 A1 * 10/2014 Park ..................... H01L 51/525
257/40

OTHER PUBLICATIONS

Hung, et al. "Application of an Ultrathin LiF/Al Bilayer in Organic Surface-Emitting Diodes" Applied Physics Letters vol. 78, No. 4 (2001) pp. 544-547.

Geng, et al. "Effect of Acid Treatment on Carbon Nanotube-Based Flexible Transparent Conducting Films" Journal of American Chemical Society vol. 129, No. 25 (2007) pp. 7758-7759.

Bae, et al. "Roll-to-Roll Production of 30-inch Graphene Films for Transparent Electrodes" Nature Nanotechnology vol. 5 (2010) pp. 574-578.

Vosgueritchian, et al. "Highly Conductive and Transparent PEDOT:PSS Films with a Fluorosurfactant for Stretchable and Flexible Transparent Electrodes" Adv. Funct. Mater. vol. 22 (2012) pp. 421-428.

* cited by examiner

ORGANIC LIGHT EMITTING DISPLAY DEVICE AND METHOD FOR MANUFACTURING SAME

CROSS-REFERENCE TO RELATED APPLICATION

Korean Patent Application No. 10-2016-0084377, filed on Jul. 4, 2016, in the Korean Intellectual Property Office, and entitled: "Organic Light Emitting Display Device and Method for Manufacturing Same," is incorporated by reference herein in its entirety.

BACKGROUND

Organic light emitting display devices are flat panel display devices that display images using organic light emitting elements which are disposed respectively in a plurality of pixels to emit light The organic light emitting elements each include an anode, a cathode, and an organic light emitting layer interposed between the anode and the cathode.

When a power signal is applied to the organic light emitting element, holes are provided to the organic light emitting layer through an anode electrode, and electrons are provided to the organic light emitting layer through a cathode electrode. Also, holes and electrons provided to the organic light emitting layer are recombined to generate excitons, and light is generated from the organic light emitting layer by energy which is generated as the states of the excitons are changed from ground states to excited states.

SUMMARY

An embodiment provides an organic light emitting device including a base substrate having a pixel region and a non-pixel region, an organic light emitting element on the pixel region, and an auxiliary line in the non-pixel region. The organic light emitting element includes an anode, a first organic light emitting layer on the anode, a first cathode, and a second cathode. The first cathode may include a metal and be on the first organic light emitting layer to be thereby electrically connected to the auxiliary line. The second cathode may include a transparent conductive oxide (TCO) and be on the first cathode to be thereby electrically connected to the first cathode.

In an embodiment, a method for manufacturing an organic light emitting display may include forming an auxiliary line in a non-pixel region of a base substrate and forming an organic light emitting element in a pixel region of the base substrate. In an embodiment, forming the organic light emitting element may include forming an anode on the base substrate and forming an organic light emitting layer on the anode. Then, a first cathode including a metal and thereby electrically connected to the auxiliary line may be formed on the organic light emitting layer. Subsequently, a second cathode including a transparent oxide and thereby electrically connected to the first cathode may be formed on the first cathode.

In an embodiment, an organic light emitting display device may include a base substrate having a pixel region and a non-pixel region, an organic light emitting element in the pixel region, and an auxiliary line in the non-pixel region. The light emitting element may include a first electrode, an organic light emitting layer on the first electrode, a second electrode on the organic light emitting layer to be electrically connected to the auxiliary line, and a third electrode cathode on the second electrode cathode to be electrically connected to the second electrode. The second and third electrodes may be made of different materials, wherein one of the second and third electrodes includes a transparent conductive oxide.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
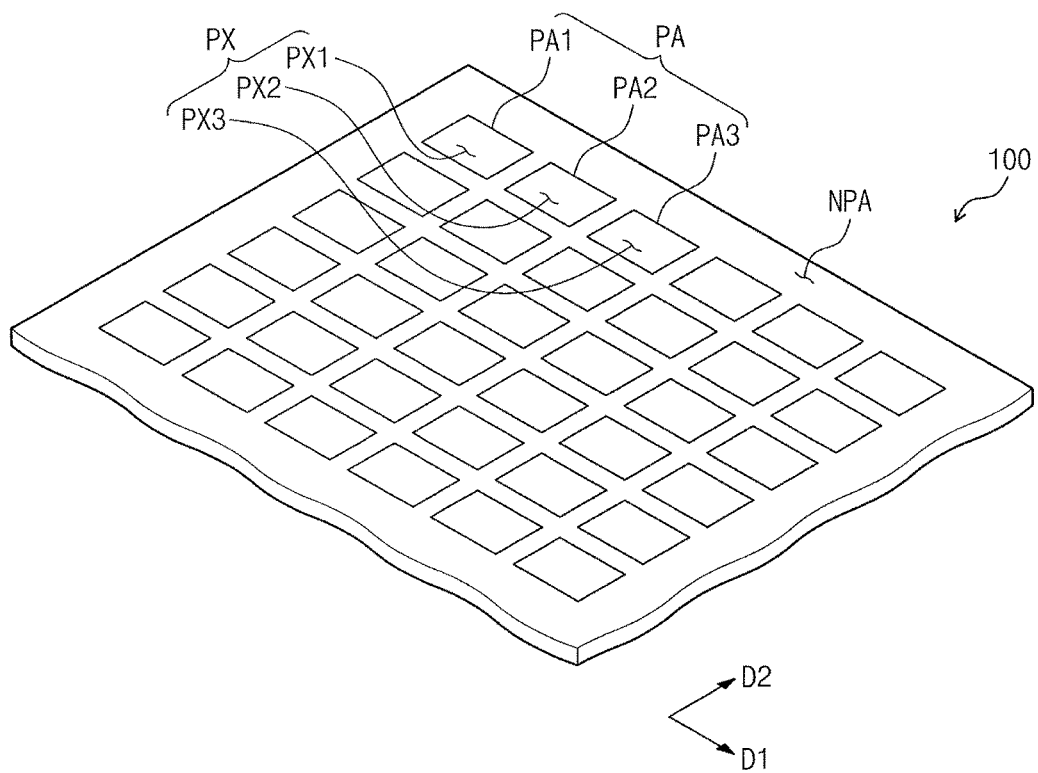
FIG. 1 illustrates a perspective view of an organic light emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Also, though the terms "first", "second", etc. are used herein for distinguishing one element from another element, these elements should not be limited by these terms. Also, it will be understood that when a film, a region, a component, etc. is referred to as being 'over' or "on" another layer, region, or plate, it can be directly on the other layer, region, or plate, or intervening layers, regions, or plates may also be present.

Figure 2A:
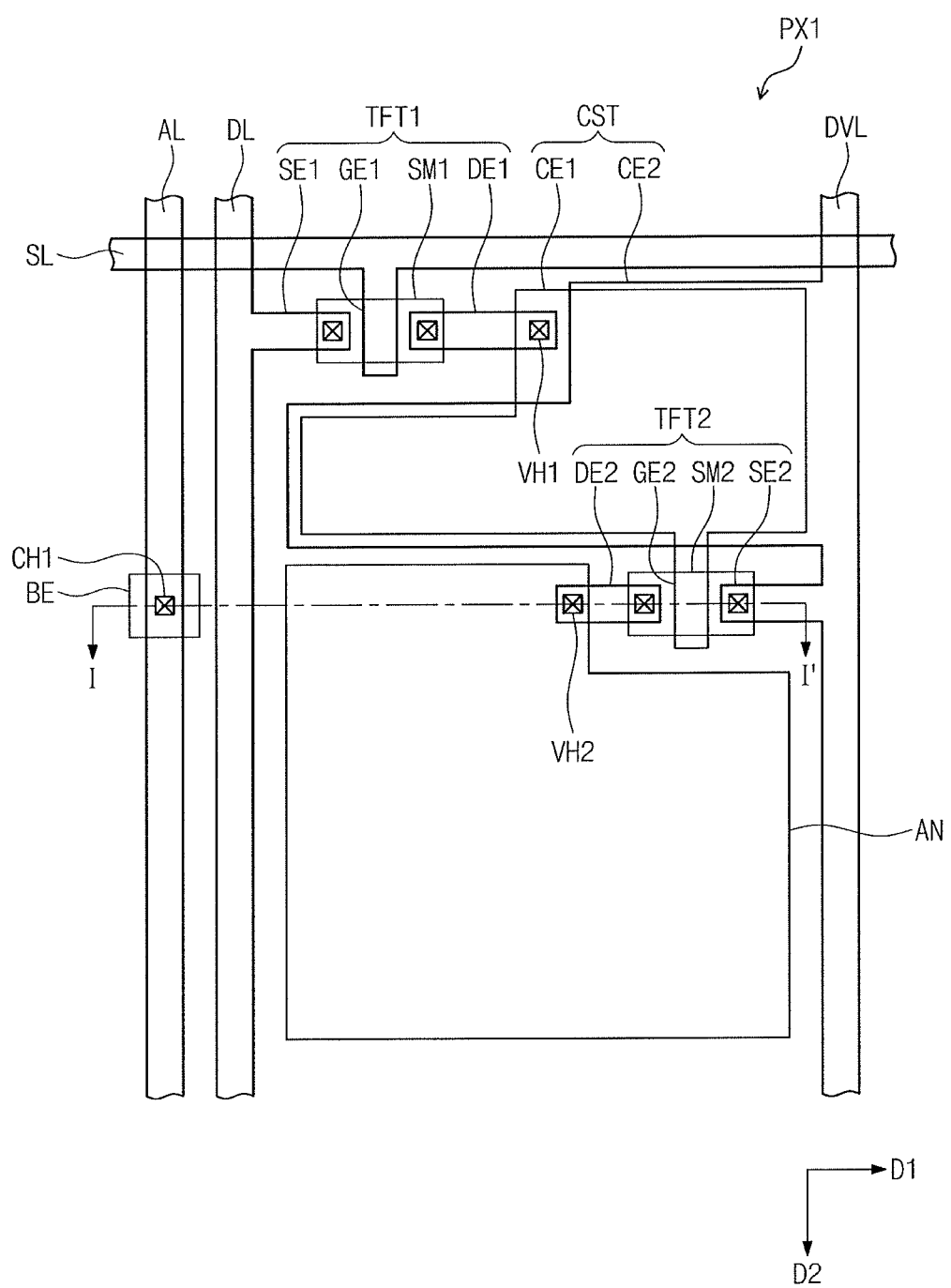
FIG. 2A illustrates a plan view of the first pixel illustrated in FIG. 1.
Figure 2B:
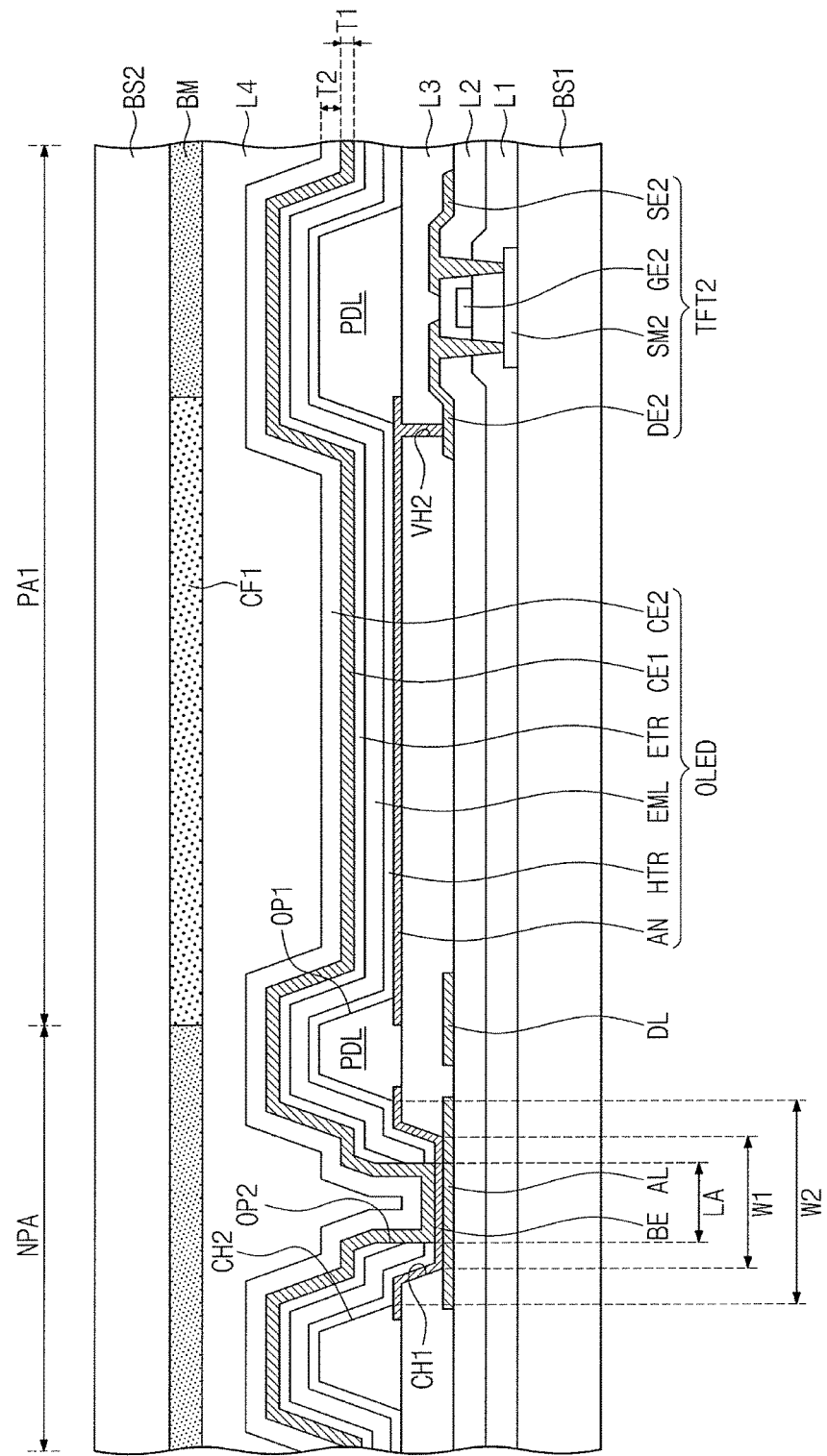
FIG. 2B illustrates a cross-sectional view taken along line I-I' in FIG. 2A.

FIG. 1 is a perspective view of an organic light emitting display device 100 according to an embodiment, FIG. 2A is a plan view of a first pixel PX1 illustrated in FIG. 1, and FIG. 2B is a cross-sectional view illustrating a cross-sectional surface taken along line I-I' illustrated in FIG. 2A.

Referring to FIGS. 1, 2A and 2B, a plurality of pixel regions PA and a non-pixel region NPA surrounding the plurality of pixel regions PA are defined in an organic light emitting device 100. The organic light emitting device 100 includes a plurality of pixels PX disposed in the plurality of pixel regions PA in a one-to-one correspondence manner. In the current embodiment, the plurality of pixels PX may be arranged in a first direction D1 and a second direction D2 perpendicular to the first direction D1. For example, the plurality of pixel regions PA include first pixel regions PA1, second pixel regions PA2, and third pixel regions PA3 which are sequentially arranged in the first direction D1, and the plurality of pixels PX include first pixels PX1 in the first pixel regions PA1, second pixels PX2 in the second pixel regions PA2, and third pixels PX3 in the third pixel regions PA3. The first to third pixels PX1, PX2, and PX3 may be sequentially arranged in the first direction D1.

Each of the plurality of pixels PX may include an organic light emitting element OLED that emits light, and the organic light emitting display device 100 displays images by using the light. In the current embodiment, the plurality of pixels PX may have structures similar to each other. Accordingly, referring to FIGS. 2A and 2B, structures of the first pixels PX1 among the plurality of pixels of the organic light emitting device 100 and structures of a plurality of lines which are electrically connected to the first pixels PX1 are exemplarily described, and descriptions about structures of the remaining pixels and other lines connected to the remaining pixels are not provided.

The organic light emitting display device 100 may include a base substrate BS1, an encapsulating substrate BS2, gate lines SL, data lines DL, power signal lines DVL, auxiliary lines AL, switching transistors TFT1, driving transistors TFT2, storage capacitors CST, organic light emitting elements OLED, and connecting electrodes BE.

The base substrate BS1 and the encapsulating substrate BS2 face each other, e.g., are spaced apart along a third direction, orthogonal to the first and second directions. Each of the base substrate BS1 and the encapsulating substrate BS2 may be a glass substrate. However, the embodiments are not limited particular substrates. For example, in another embodiment, one or both of the base substrate BS1 and the encapsulating substrate BS2 may be a plastic substrate.

The gate lines SL may be on the base substrate BS1 to transmit gate signals. The data lines DL, insulated from the gate lines SL, may be on the base substrate BS1 to transmit data signals. In the current embodiment, the gate lines SL may extend in the first direction D1 and the data lines DL may extend in the second direction D2.

The switching transistors TFT1 are electrically connected to the gate lines SL and the data lines DL. The switching transistors TFT1 receive gate signals through the gate lines SL and receive data signals through the data lines DL.

The switching transistors TFT1 each include a first semiconductor pattern SM1, a first control electrode (hereinafter, a first gate electrode GE1), a first input electrode (hereinafter, a first source electrode SE1), and a first output electrode (hereinafter, a first drain electrode DE1).

The first semiconductor pattern SM1 may include a semiconductor material. In the current embodiment, a composition material of the first semiconductor pattern SM1 may include polycrystalline silicon. However, embodiments are not limited to the above-mentioned composition material of the first semiconductor pattern SM1. For example, in another embodiment, the first semiconductor pattern SM1 may also include an oxide semiconductor, e.g., Indium gallium zinc oxide (IGZO), zinc oxide (ZnO), tin oxide ($SnO_2$), indium oxide ($In_2O_3$), zinc tin oxide ($Zn_2SnO_4$), germanium oxide ($Ge_2O_3$), or hafnium oxide ($HfO_2$). In still another embodiment, the first semiconductor pattern SM1 may also include a compound semiconductor, e.g., gallium arsenide (GaAs), gallium phosphide (GaP), or indium phosphide (InP). In yet still embodiment, the first semiconductor pattern SM1 may also include amorphous silicon.

The first gate electrode GE1 is connected to the gate lines SL, e.g., extends along a second direction from the gate lines SL towards the first semiconductor pattern, and overlaps the first semiconductor pattern SM1. Also, the first source electrode SE1 is connected to the data lines DL to be thereby brought into contact with a source region of the first semiconductor pattern SM1, and the first drain electrode DE1 is brought into contact with a drain region of the first semiconductor pattern SM1 to be thereby electrically connected with a storage capacitor CST.

The storage capacitor CST may include a first storage electrode CE1 and a second storage electrode CE2 that overlap each other. The first storage electrode CE1 may be electrically connected to the first drain electrode DE1 through a first via hole VH1. Also, at least any one of a gate insulating layer L1 or an intermediate insulating layer L2 may be interposed between the first and second storage electrodes CE1 and CE2.

The first storage electrode CE1 may be connected to the first drain electrode DE1 and the second storage electrode CE2 may be electrically connected to a power signal line DVL. Accordingly, the storage capacitor CST charges an amount of electric charge corresponding to a difference in a voltage corresponding to a data signal received from the switching transistor TFT1 and a voltage corresponding to a power signal received from the power signal line DVL, The charged amount of electric charge may be provided to a driving transistor TFT2 when the switching transistor TFT1 is turned off.

The driving transistor TFT2 may be between the base substrate BS1 and the organic light emitting element OLED. The driving transistor TFT2 is electrically connected to the switching transistor TFT1, the power signal line DVL and the organic light emitting element OLED, and the driving transistor TFT2 switches a power signal provided from the power signal line DVL toward the organic light emitting element OLED.

The switching transistor TFT2 may include a second semiconductor pattern SM2, a second control electrode (hereinafter, a second gate electrode GE2), a second input electrode (hereinafter, a second source electrode SE2), and a second output electrode (hereinafter, a second drain electrode DE2). The second gate electrode GE2 may be connected to the first drain electrode DE1 through the first storage electrode CE1. The second source electrode SE2 may be electrically connected to the power signal line DVL. Also, the second drain electrode DE2 may be electrically connected to the organic light emitting element OLED through a second via hole VH2 defined in a cover insulating layer L3.

A gate insulating layer L1 may cover the second semiconductor pattern SM2, e.g., may cover an upper surface and side surfaces of the second semiconductor pattern SM2. An intermediate insulating layer L2 may be on the gate insulating layer L1 to thereby cover the second gate electrode GE2, e.g., may cover an upper surface and side surfaces of the second gate electrode GE2.

The cover insulating layer L3 may be between the base substrate BS1 and the organic light emitting element OLED, e.g., an anode AN of the organic light emitting element OLED. The cover insulating layer L3 may be disposed on the intermediate insulating layer L2 to thereby cover the second source electrode SE2 and the second drain electrode DE2, as well as the auxiliary lines AL and the data lines DL.

The auxiliary lines AL are disposed in the non-pixel region NPA to be spaced apart from the data lines DL. In the current embodiment, the auxiliary line AL may be a metal layer including silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), lithium fluoride (LiF)/Ca, LiF/Al, molybdenum (Mo), titanium (Ti), or a compound thereof. In another embodiment, the auxiliary line AL may further include a metal oxide layer laminated on the metal layer, and the metal oxide layer may include a conductive oxide such as indium tin oxide (ITO), indium zinc oxide (IZO), zinc oxide (ZnO), or indium tin zinc oxide (ITZO).

In the current embodiment, like the data lines DL, the second source electrode SE2, and the second drain electrode DE2, the auxiliary lines AL may be disposed on the intermediate insulating layer L2. Like the current embodiment, when the driving transistor TFT2 has a bottom-gate structure, the auxiliary line AL may include a same composition material as the second source electrode SE2 and the second drain electrode DE2. For example, in the current embodiment, each of the data line DL, the second source electrode SE2, and the second drain electrode DE2 may have a three-layer laminated structure of molybdenum layer/aluminum layer/molybdenum layer, and in this case, the auxiliary line AL may have the three-layer laminated structure. In another embodiment, the driving transistor TFT2 may have a top-gate structure, and, in this case, the auxiliary line AL may include a same material as the second gate electrode GE2 and may be covered by the intermediate insulating layer L2.

The organic light emitting element OLED emits light by responding to the power signal provided through the driving transistor TFT2. In the current embodiment, the organic light emitting element OLED includes an anode AN, a hole control layer HTR, an organic light emitting layer EML, an electron control layer ETR, a first cathode CE1, and the second cathode CE2. The driving transistor TFT2 may be between the base substrate BS1 and the anode AN. The anode AN may be on the cover insulating layer L3 and electrically connected to the second drain electrode DE2 through the second via hole VH2 passing through the cover insulating layer L3.

In the current embodiment, the anode AN may be a reflective electrode, and in this case, the anode AN may be a metal layer including a metal such as Ag, Mg, Al, Pt, Pd, Au, Ni, Nd, Ir, or Cr. In another embodiment, the anode AN may further include a metal oxide layer laminated on the metal layer. For example, the anode AN may have a double-layer structure of ITO/Mg or ITO/MgF, or a multilayer structure such as ITO/Ag/ITO.

A pixel defining layer PDL is disposed over the anode AN. A first opening part OP1 is defined corresponding to the position of the anode AN in the pixel defining layer PDL, and the organic light emitting layer EML may be laminated on the anode AN through the first opening part OP1.

In the current embodiment, the hole control layer HTR may include a hole injection layer and a hole transport layer.

In another embodiment, the hole control layer HTR may further include at least one of a hole buffer layer or an electron blocking layer.

In the current embodiment, the hole injection layer my include a hole injection material, and the hole injection material may include a phthlocyamine compound, e.g., copper phthlocyamine; and N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4',4"-Tris(N,N-diphenylamino) triphenylamine (TDATA), 4,4',4"-tris{N,-(2-naphthyl)-N-phenylamino}-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), and (Polyaniline)/Poly(4-styrenesulfonate) (PANI/PSS), etc. However, embodiments are not limited to a particular hole injection material.

In an embodiment, the hole injection layer may further include an electric charge generation material to improve conductivity of the hole control layer HTR. The electric charge generation material may be a p-type dopant, and the p-type dopant may be one of a quinine derivative, a metal oxide or a cyano group containing-compound, but embodiments are not limited to particular p-type dopant. For example, in another embodiment, the p-type dopant may also include a quinone derivative, e.g., tetracyanoquinodimethane (TCNQ) or 2,3,5,6-tetrafluoro-tetracyanoquinodimethane (F4-TCNQ), and a metal oxide, e.g., a tungsten oxide or a molybdenum oxide.

The hole transport layer includes a hole transport material. The hole transport material may include a carbazole-based derivative, e.g., N-phenyl carbazole or polyvinyl carbazole, a fluorine-based derivative, a triphenylamine-based derivative, e.g., N,N'-bis(3-methylphenyl)-N,N'-diphenyl-[1,1-biphenyl]-4,4'-diamine (TPD) or 4,4',4"-tris(N-carbazolyl)triphenylamine (TCTA), N,N'-di(1-naphthyl)-N, N'-diphenylbenzidine (NPB), 4,4'-Cyclohexylidene bis[N, N-bis(4-methylphenyl)benzenamine] (TAPC), or the like. However, embodiments are not limited to a particular hole transport layer.

The organic light emitting layer EML is disposed on the hole control layer HTR. In the current embodiment, the organic light emitting layer EML may emit white light, and the organic light emitting layer EML may have a film-like shape continuously extending over the plurality of pixel regions PA and the non-pixel region NPA.

In the current embodiment, the organic light emitting device 100 may be a top-emission type. Accordingly, white light emitted from the organic light emitting layer EML may be output to the outside of the organic light emitting display device 100 by sequentially passing through the first cathode CE1, the second cathode CE2, and the encapsulation substrate BS2. Also, a first color filter CF1 may be located in the path of the white light output to filter the white light into color light.

The electron control layer ETR may have a structure in which an electron transport layer and an electron injection layer are laminated. In another embodiment, the electron injection layer may not be provided in the electron control layer ETR.

The electron transport layer includes an electron transport material, e.g., Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (BPhen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate) (Bebq2), 9,10-di(naphthalene-2-yl) anthracene (ADN) and mixtures thereof. However, embodiments are not limited to a particular electron transport layer.

The electron injection layer includes an electron injection material, and the electron injection material may include lanthanum group metals such as LiF, lithium quinolate (LiQ), lithium oxide ($Li_2O$), barium oxide (BaO), sodium chloride (NaCl), cesium fluoride (CsF), and ytterbium (Yb), or metal halides, e.g., rubidium chloride (RbCl) or rubidium iodide (RbI), or the like. However, embodiments are not limited to a particular electron injection material. For example, in another embodiment, the electron injection layer may include a material in which the electron transport material and an organo metal salt are mixed, and the organo metal salt may be a material having an energy band gap of about 4 eV or more. Specifically, for example, the organo metal salt may include metal acetate, metal benzodate, metal acetoacetate, metal acetylacetonate, or metal stearate.

The first cathode CE1 may be on the organic light emitting layer EML. The second cathode CE2 may be on and electrically connected to the first cathode CE1. In the current embodiment, each of the first and second cathodes CE1 and CE2 may be light transmissive.

The first cathode CE1 may be connected to the auxiliary line AL, e.g., through the connecting electrode BE. More specifically, a first contact hole CH1 overlapping the auxiliary line AL along the third direction may be defined in the cover insulating layer L3, and a second contact hole CH2, overlapping the first contact hole CH1 along the third direction, may be defined in the pixel defining layer PDL. In the current embodiment, a second width W2 along the first direction of the second contact hole CH2 may be greater than a first width W1 along the first direction of the first contact hole CH1. Also, when viewed in a plane, e.g., the first and second direction plane, the first contact hole CH1 may be located inside the second contact hole CH2.

Also, a laser irradiation region LA may be defined in one region of the non-pixel region NPA, a second opening part OP2 is defined in each of the organic light emitting layer EML, the hole control layer HTR, and the electron control layer ETR in the laser irradiation region LA, and the second opening part OP2 overlaps each of the first contact hole CH1 and the second contact hole CH2 along the third direction. The first cathode CE1 may be connected to the connecting electrode BE through the first and second contact holes CH1 and CH2, and the second opening part OP2, to thereby be connected to the auxiliary line AL.

The second opening part OP2 may be formed such that each of the organic light emitting layer EML, the hole control layer HTR and the electron control layer ETR is irradiated with laser (LR of FIG. 7C), and in the current embodiment, the connecting electrode BE may be brought into contact with the auxiliary line AL in the laser irradiation region LA. Accordingly, even if the connecting electrode BE is partially damaged by the laser, since a lower portion of the connecting electrode BE is supported by the auxiliary line AL, the contact between the connecting electrode BE and the auxiliary line AL may be prevented from becoming unstable due to the damaged portion of the connecting electrode BE.

In the current embodiment, a composition material of the connecting electrode BE may be the same as that of the anode AN, and the laminated structure of the connecting electrode BE may be the same as that of the anode AN. For example, each of the anode AN and the connecting electrode BE may have a three-layer laminated structure of ITO/Ag/ITO.

Like the current embodiment, when the first and second cathodes CE1 and CE2 are connected to the auxiliary line AL, even if each of the first and second cathodes CE1 and CE2 has a shape of a light transmissive thin film, the electrical resistance of the first and second cathodes CE1 and CE2 may be decreased by the auxiliary line AL.

In the current embodiment, a composition material of the first cathode CE1 may be different from that of the second cathode CE2. For example, the In the current embodiment, the composition material of the first cathode CE1 may include Ag, Mg, Cu, Al, Pt, Pd, Au, Ni, Nd, Ir, Cr, Li, Ca, LiF/Ca, LiF/Al, Mo, Ti, or compounds or mixtures thereof, e.g., a mixture of Ag and Mg. As described above, even if the metal material of the first cathode CE1 includes metal, in the current embodiment, a first thickness T1 of the first cathode CE1 may be about several ten Angstroms such that the first cathode CE1 may still be light transmitting.

The composition material of the second cathode CE2 may include a transparent conductive oxide (TCO). For example, the composition material of the second cathode CE2 may include tungsten oxide ($W_xO_x$), titanium oxide ($TiO_2$), indium tin oxide (ITO), indium zinc oxide (IZO), zinc oxide (ZnO), indium tin zinc oxide (ITZO) or magnesium oxide (MgO). In another embodiment, the second cathode CE2 may also include graphene or carbon nanotubes.

In the current embodiment, a second thickness T2 of the second cathode CE2 may be greater than a first thickness T1 of the first cathode CE1. Since the composition material of the second cathode CE2 may include a transparent conductive oxide, even if the second thickness T2 is increased to decrease the electrical resistance of the second cathode CE2, the decrease of the light transmitting property of the second cathode CE2 may be minimized.

Comparing a structure of the first and second cathodes CE1 and CE2 according to an embodiment and a structure of a cathode including only transparent conductive oxides, electron injection characteristics of the first and second cathodes CE1 and CE2 may be improved by the first cathode CE1 including metal. Thus, the light emitting efficiency of the organic light emitting element OLED may be improved. Also, when the second cathode CE2 is formed through a sputtering method, the first cathode CE1 may prevent the sputtered particles from penetrating into the organic light emitting layer EML. Thus, the organic light emitting layer EML may be prevented from being damaged by the sputtered particles. Also, comparing the structure of the first and second cathodes CE1 and CE2 according to an embodiment and a structure of a cathode including only transparent conductive oxides, the light transmitting property of the first and second cathodes CE1 and CE2 are not deteriorated by the second cathode CE2 including a transparent conductive oxide and the electrical resistance may be decreased.

As described above in detail, when the first and second contact holes CH1 and CH2 are formed to overlap each other, in order to bring the first cathode CE1 into contact with the connecting electrode BE, a step which approximately corresponds to the sum of the thickness of the pixel defining layer PDL and the thickness of the third cover insulating layer L3 may be generated in the first cathode CE1. In the current embodiment, even though the step is generated in the first cathode CE1, since the first cathode CE1 is covered by the second cathode CE2, the first and second cathodes CE1 and CE2 may be stably connected to the connecting electrode BE.

A thin encapsulating layer L4 may be on the first and second cathodes CE1 and CE2 to encapsulate the organic light emitting element OLED. In the current embodiment, the thin encapsulating layer L4 may have a structure in which an inorganic layer including inorganics, e.g., silicon nitride, and an organic layer, e.g., including acrylate-based organics, are alternately repeated.

A black matrix BM and the first color filter CF1 may be on the thin encapsulating layer L4. The black matrix BM may correspond to the non-pixel region NPA, e.g., overlap the non-pixel region NPA along the third direction. The first color filter CF1 may correspond to the first pixel region PA1 and overlap the organic light emitting element OLED, e.g., along the third direction.

In the current embodiment, the encapsulating substrate BS2 may be disposed over the black matrix BM and the first color filter CF1. In another embodiment, a protective layer may be disposed instead of the encapsulating substrate BS2, and the protective layer may include an organic or inorganic layer.

Figure 3A:
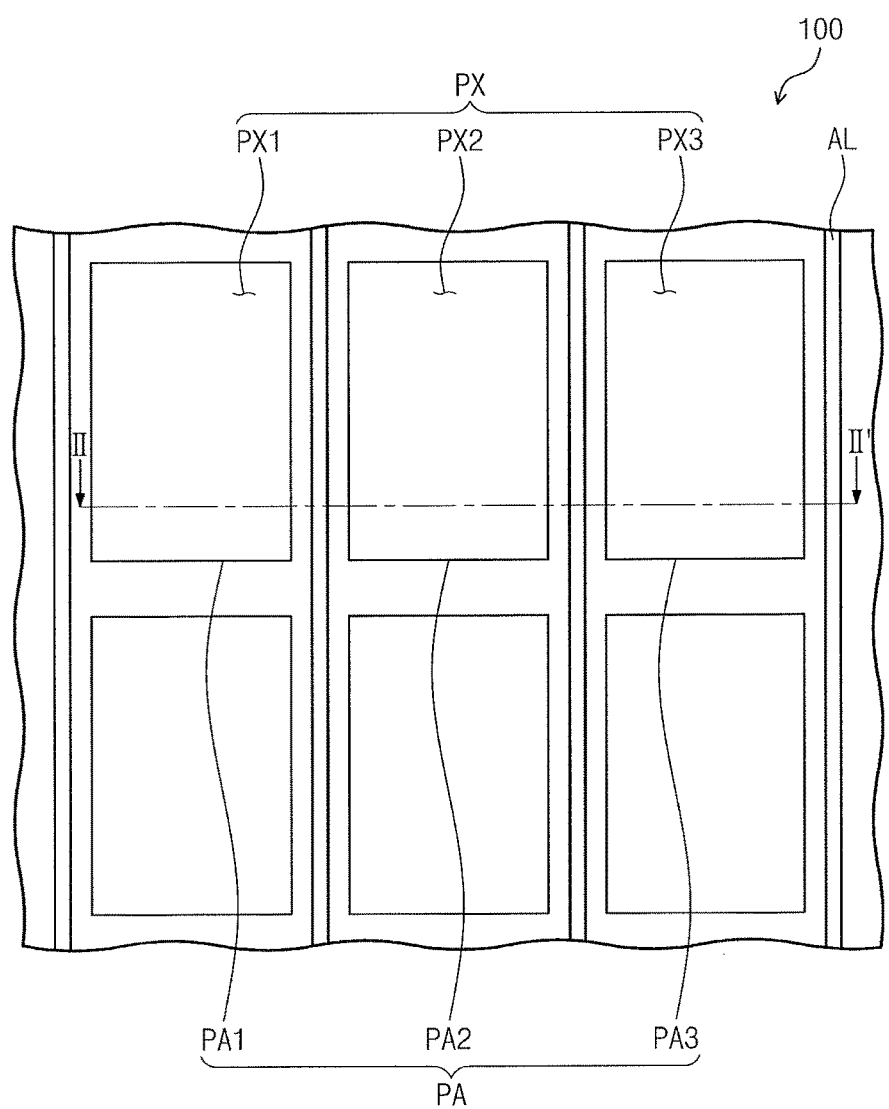
FIG. 3A illustrates an enlarged plan view of the first pixel, the second pixel, and the third pixel in FIG. 1.
Figure 3B:
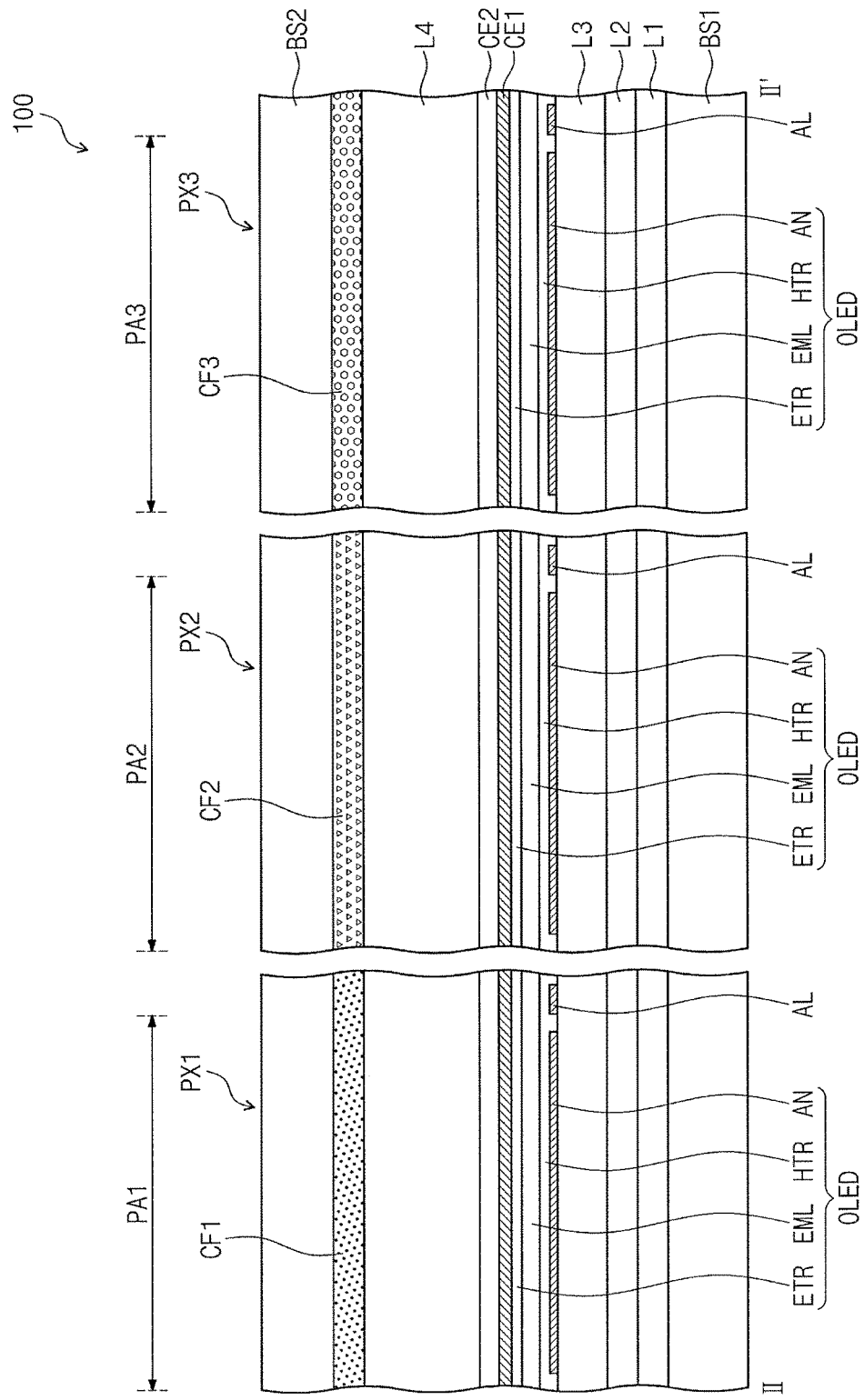
FIG. 3B illustrates a cross-sectional view taken along line II-II' in FIG. 3A.

FIG. 3A is an enlarged plan view illustrating the first pixel PX1, the second pixel PX2, and the third pixel PX3 illustrated in FIG. 1. FIG. 3B is a cross-sectional view illustrating a cross-section taken along line II-II' illustrated in FIG. 3A. Referring to FIGS. 3A and 3B, the first pixel PX1 described with reference to FIGS. 2A and 2B is disposed in the first pixel region PA1, the second pixel PX2 is disposed in the second pixel region PA2, and the third pixel PX3 is disposed in the third pixel region PA3.

In the current embodiment, each of the first to third pixels PX1, PX2, and PX3 may include the organic light emitting element OLED described above with reference to FIGS. 2A and 2B and emits white light. Also, the first pixel PX1 includes a first color filter CF1, the second pixel PX2 includes a second color filter CF2, and the third pixel PX3 includes a third color filter CF3.

In the current embodiment, the first color filter CF1 may be a red color filter, the second color filter CF2 may be a green color filter, and the third color filter CF3 may be a blue color filter. Accordingly, red light may be output from the first pixel PX1 in the first pixel region PA1, green light may be output from the second pixel PX2 in the second pixel region PA2, and blue light may be output from the third pixel PX3 in the third pixel region PA3.

In the current embodiment, the organic light emitting layer EML may be disposed on the anode AN in the organic light emitting element OLED and may be a shape of a single film disposed across the first to third pixel regions PA1, PA2 and PA3. Also, in the organic light emitting element OLED, each of the hole control layer HTR and the electron control layer ETR may be a single film disposed across the first to third pixel regions PA1, PA2 and PA3.

Figure 4:
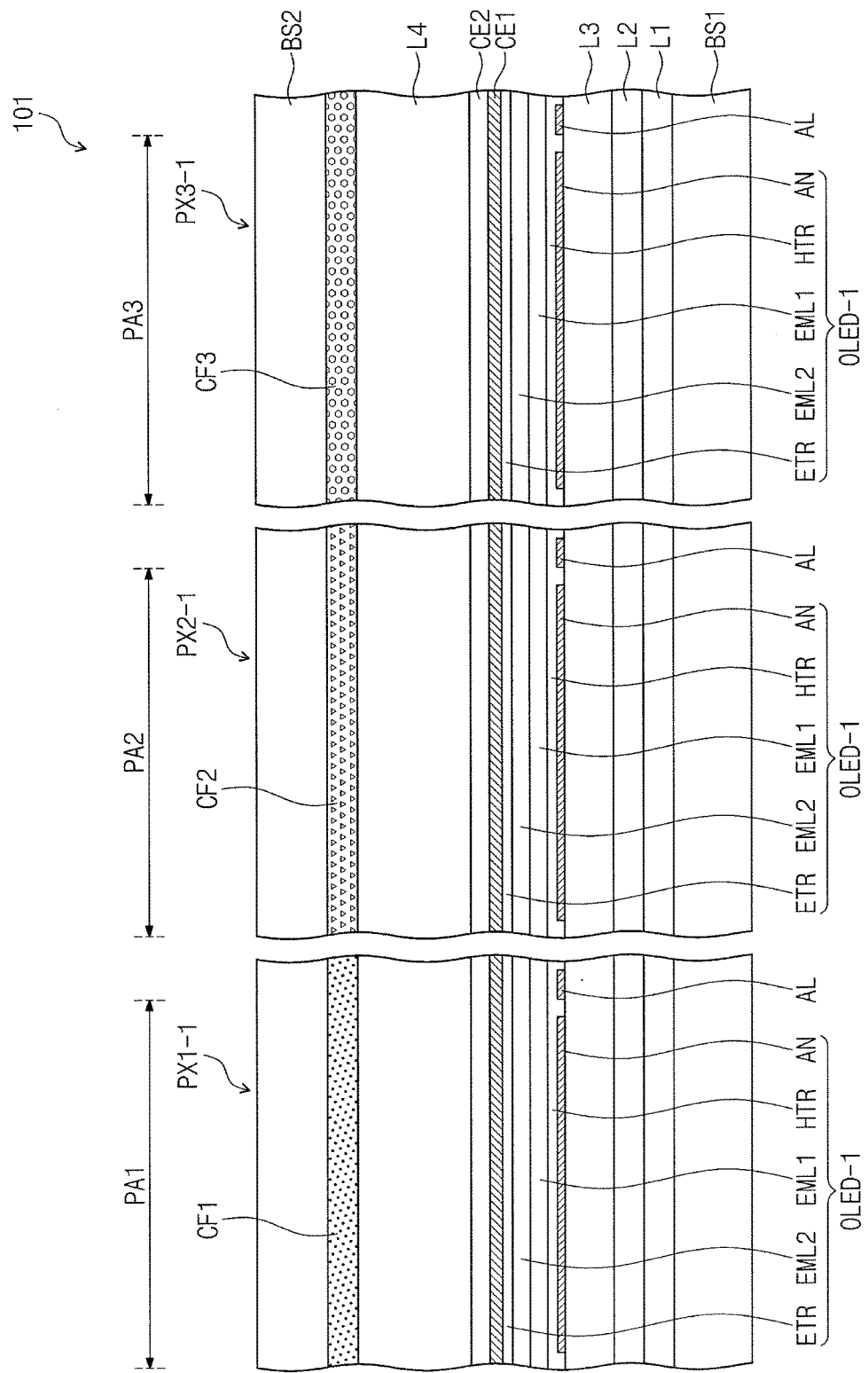
FIG. 4 illustrates a cross-sectional view of an organic light emitting display device according to another embodiment.

FIG. 4 is a cross-sectional view of an organic light emitting display device 101 according to another embodiment. In describing FIG. 4, previously described components will be designated by the same reference numerals, and overlapping descriptions thereof will not be provided. Referring to FIG. 4, an organic light emitting display device 101 may include a first pixel PX1-1 in a first pixel region PA1, a second pixel PX2-1 in a second pixel region PA2, and a third pixel PX3-1 in a third pixel region PA3.

Each of the first to third pixels PX1-1, PX2-1, and PX3-1 may include an organic light emitting element OLED-1. In the current embodiment, the light emitting element OLED-1 may include the anode AN, the hole control layer HTR, a first organic light emitting layer EML1, a second organic light emitting layer EML2, the electron control layer ETR, the first cathode CE1, and the second cathode CE2, which are sequentially laminated along the third direction on the base substrate BS1. The first organic light emitting layer EML1 may be in contact with the second organic light emitting layer EML2.

In the current embodiment, the first and second organic light emitting layers EML1 and EML2 may emit light having wavelengths different from each other. For example, the first organic light emitting layer EML1 may emit blue light, and the second organic light emitting layer EML2 may emit yellow light. Accordingly, light emitted from the first and second organic light emitting layers EML1 and EML2 are mixed and may be filtered into color light by a corresponding color filter from among the first to third color filters CF1, CF2, and CF3.

Also, the auxiliary line AL may be on the cover insulating layer L3 and adjacent to each of the first to third pixels PX1-1, PX2-1, and PX3-1. As described above with reference to FIGS. 2A and 2B, the auxiliary line AL may be electrically connected to the first cathode CE1 through a connecting electrode (BE of FIG. 2B).

Figure 5:
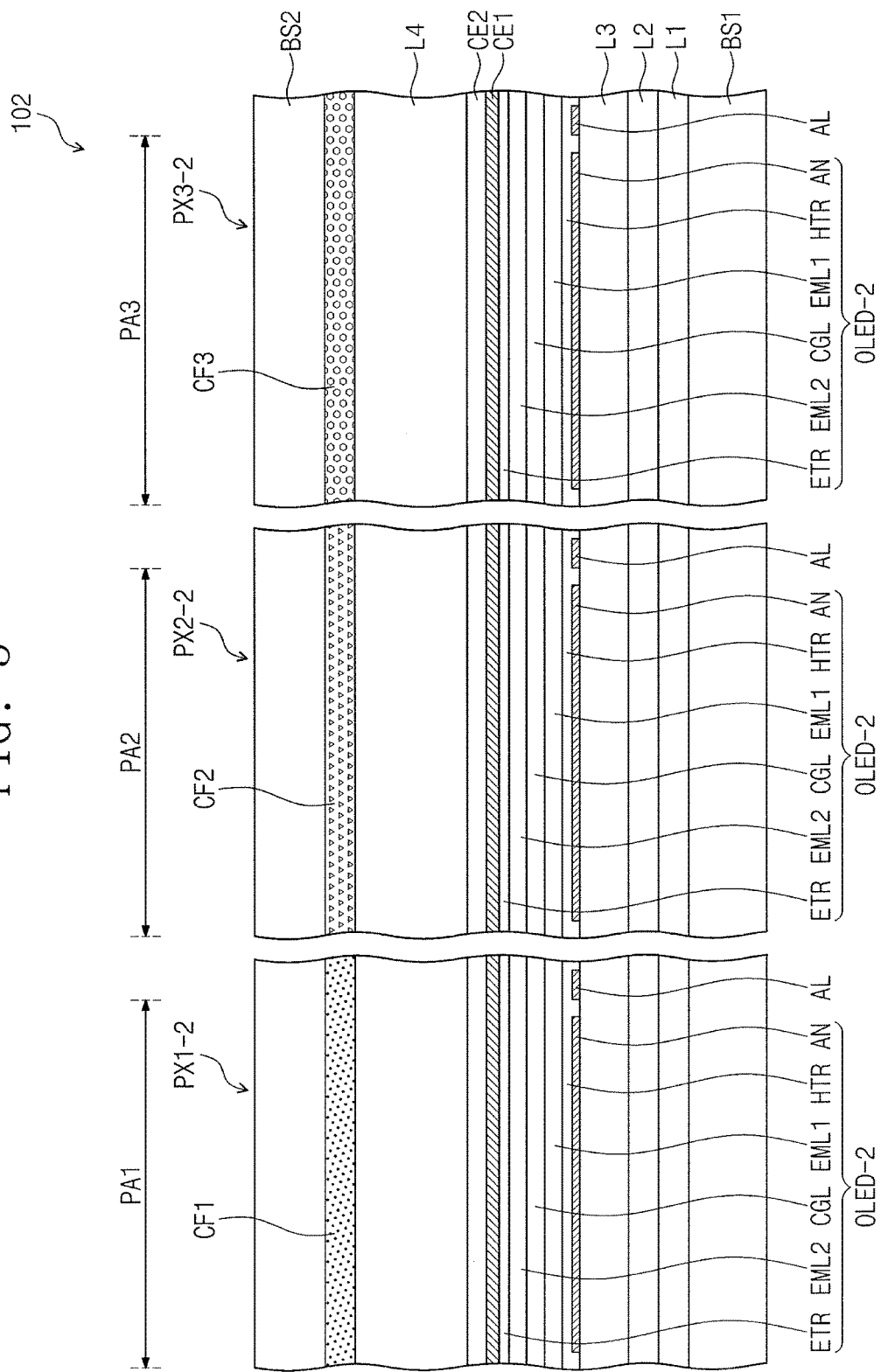
FIG. 5 illustrates a cross-sectional view of an organic light emitting display device according to another embodiment.

FIG. 5 is a cross-sectional view of an organic light emitting display device 102 according to another embodiment. In describing FIG. 5, previously described components will be designated by the same reference numerals, and overlapping descriptions thereof will not be provided. Referring to FIG. 5, an organic light emitting display device 102 may include a first pixel PX1-2 in a first pixel region PA1, a second pixel PX2-2 in a second pixel region PA2, and a third pixel PX3-2 in a third pixel region PA3.

Each of the first to third pixels PX1-2, PX2-2, and PX3-2 may include an organic light emitting element OLED-2. In the current embodiment, the organic light emitting element OLED-2 may include the anode AN, the hole control layer HTR, the first organic light emitting layer EML1, an electric charge generating layer CGL, the second organic light emitting layer EML2, the electron control layer ETR, the first cathode CE1, and the second cathode CE2, which are sequentially laminated on a base substrate BS1 along the third direction. The electric charge generating layer CGL may be between the first and second organic light emitting layers EML1 and EML2.

In the current embodiment, the electric charge generating layer CGL may include an electron generating layer including n-type dopants and a hole generating layer including p-type dopants, and the electron generating layer and the hole generating layer may be sequentially laminated on the first organic light emitting layer EML1. The electron generating layer may be an organic layer doped with the n-type dopants, and the organic layer may include the electron transport material described above with reference to FIGS. 2A and 2B. Also, the hole generating layer may be an organic layer doped with the p-type dopants, and the organic layer may include the hole transport material described above with reference to FIGS. 2A and 2B.

In the current embodiment, like the embodiment described with reference to FIG. 4, the first and second organic light emitting layers EML1 and EML2 may emit light having wavelengths different from each other. For example, the first organic light emitting layer EML1 may emit blue light, and the second organic light emitting layer EML2 may emit yellow light. Accordingly, light emitted from the first and second organic light emitting layers EML1 and EML2 are mixed, and the mixed light may be filtered into color light by a corresponding color filter from among the first to third color filters CF1, CF2, and CF3.

Also, the auxiliary line AL may be on the cover insulating layer L3 adjacent to each of the first to third pixels PX1-2, PX2-2, and PX3-2. As described above with reference to FIGS. 2A and 2B, the auxiliary line AL is electrically connected to the first cathode CE1 through a connecting electrode (BE of FIG. 2B).

Figure 6:
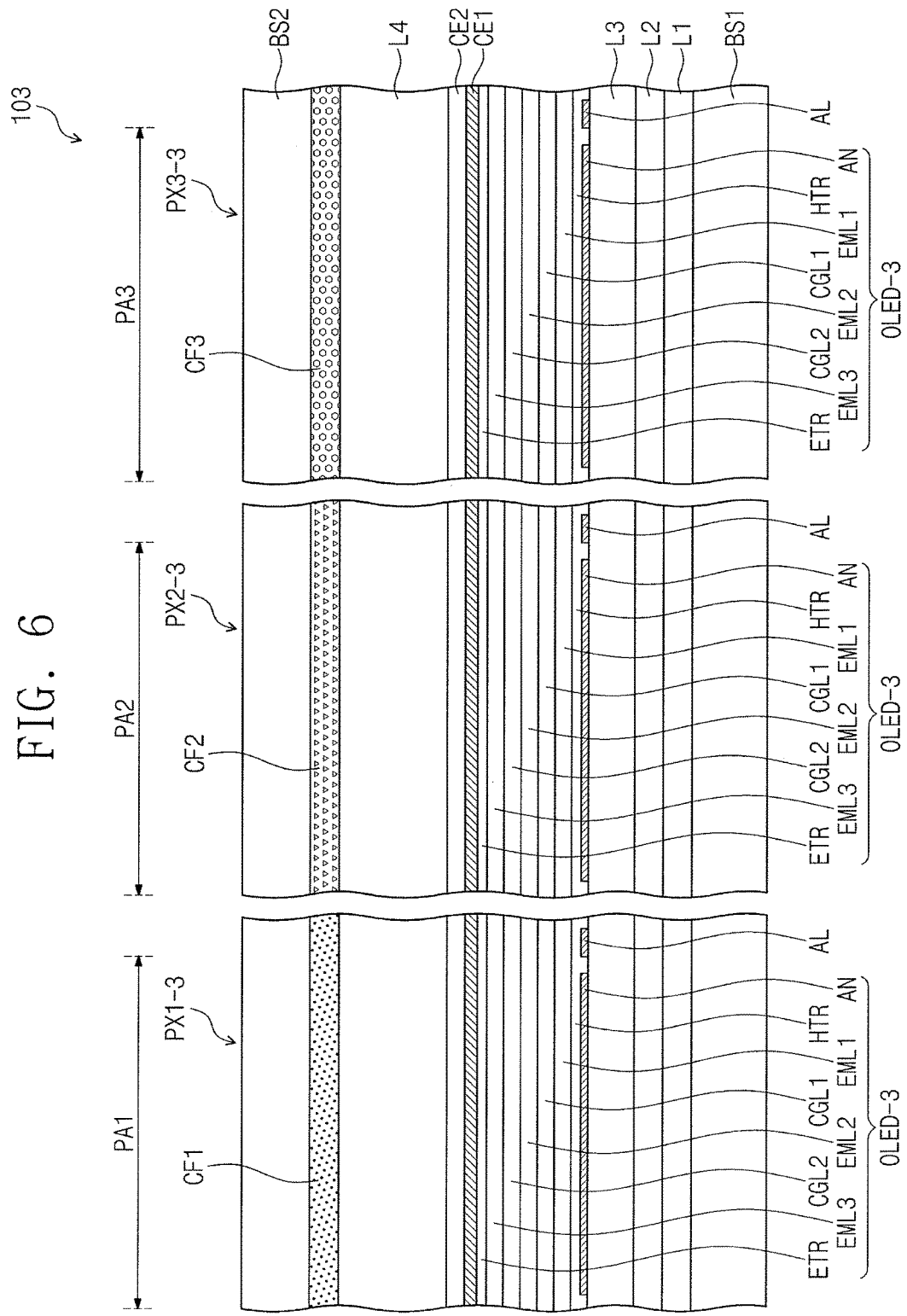
FIG. 6 illustrates a cross-sectional view of an organic light emitting display device according to another embodiment.

FIG. 6 is a cross-sectional view of an organic light emitting display device 103 according to another embodiment. In describing FIG. 6, previously described components will be designated by the same reference numerals, and overlapping descriptions thereof will not be provided. Referring to FIG. 6, an organic light emitting display device 103 may include a first pixel PX1-3 disposed in a first pixel region PA1, a second pixel PX2-3 disposed in a second pixel region PA2, and a third pixel PX3-3 disposed in a third pixel region PA3.

Each of the first to third pixels PX1-3, PX2-3, and PX3-3 may include an organic light emitting element OLED-3. In the current embodiment, the light emitting element OLED-3 may include the anode AN, the hole control layer HTR, the first organic light emitting layer EML1, a first electric charge generating layer CGL1, the second organic light emitting layer EML2, a second electric charge generating layer CGL2, a third organic light emitting layer EML3, the electron control layer ETR, the first cathode CE1, and the second cathode CE2, which are sequentially laminated on a base substrate BS1 along the third direction. The first electric charge generating layer CGL1 may be between the first and second organic light emitting layers EML1 and EML2. The second electric charge generating layer CGL2 may be between the second and third organic light emitting layers EML2 and EML3.

In the current embodiment, the first to third organic light emitting layers EML1, EML2 and EML3 may emit light having wavelengths different from each other. For example, the first organic light emitting layer EML1 may emit blue light, the second organic light emitting layer EML2 may emit yellow light, and the third organic light emitting layer EML3 may emit green light.

In another embodiment, two organic light emitting layers of the first to third organic light emitting layers EML1, EML2 and EML3 may emit the same light as each other, and the one remaining organic light emitting layer may emit light different from the light emitted from the two organic light emitting layers. For example, each of the first and second organic light emitting layers EML1 and EML2 may emit blue light, and the third organic light emitting layers EML3 may emit yellow light. Accordingly, light emitted from the first to third organic light emitting layers EML1, EML2 and EML3 are mixed, and the mixed light may be filtered into color light by a corresponding color filter from among the first to third color filters CF1, CF2, and CF3.

Also, an auxiliary line AL may be on the cover insulating layer L3 adjacent to each of the first to third pixels PX1-3, PX2-3, and PX3-3, and as described above with reference to FIGS. 2A and 2B, the auxiliary line AL is electrically connected to the first cathode CE1 through a connecting electrode (BE of FIG. 2B).

FIGS. 7A to 7H are views illustrating stages in a method for manufacturing the organic light emitting display device 100 illustrated in FIG. 2B. In describing FIGS. 7A and 7H, previously described components will be designated by the same reference numerals, and overlapping descriptions thereof will not be provided.

Figure 7A:
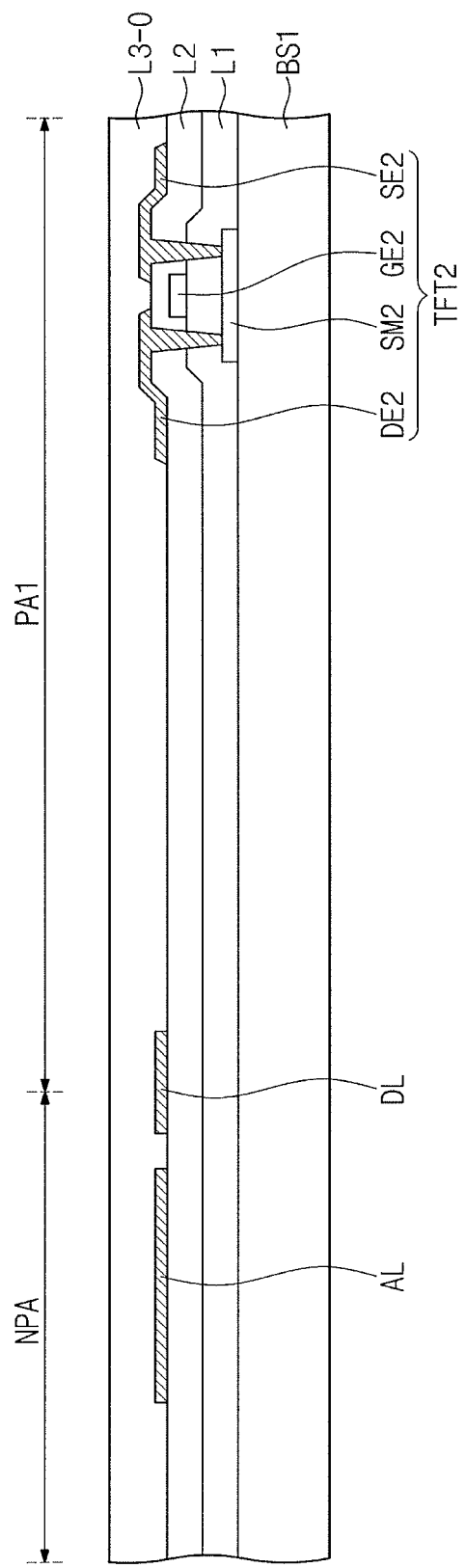
FIGS. 7A to 7H illustrate views of stages in a method for manufacturing the organic light emitting display device illustrated in FIG. 2B.
Figure 7B:
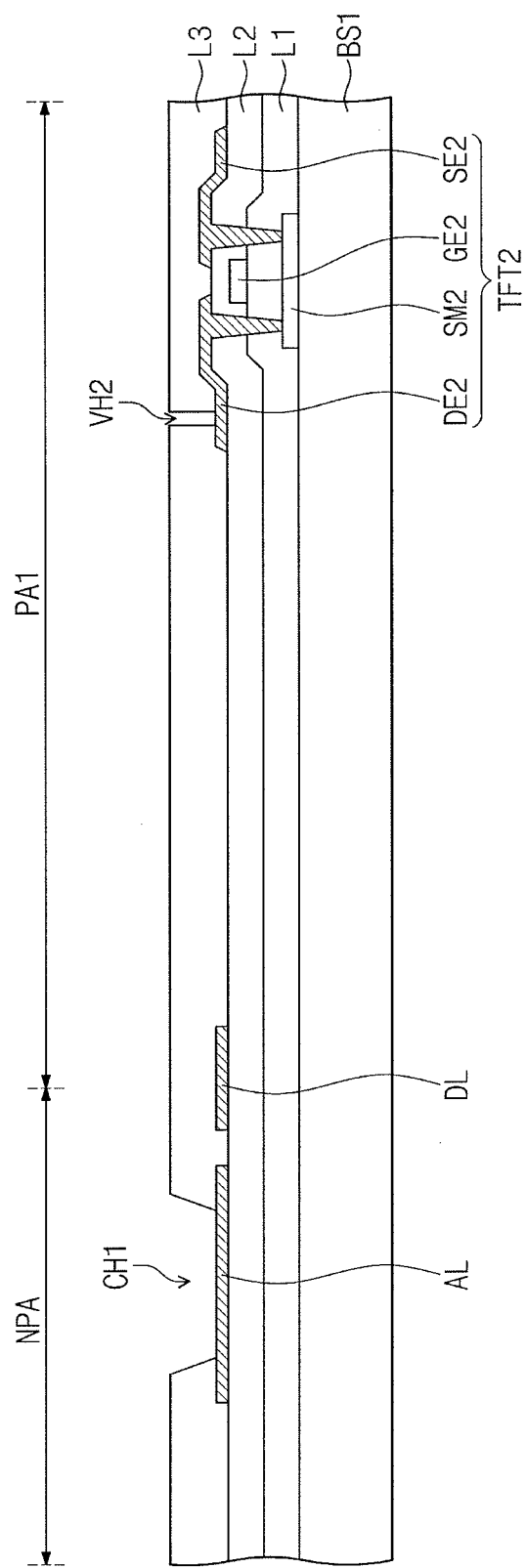

Referring to FIGS. 7A and 7B, the driving transistor TFT2, the auxiliary line AL, and the data line DL are formed on the base substrate BS1. Also, a gate line (SL of FIG. 2A), a power signal line (DVL in FIG. 2A), and a switching transistor (TFT1 of FIG. 2A) are formed on the base substrate BS1.

In the current embodiment, the auxiliary line AL may be formed through the same process as the second source electrode SE2 and the second drain electrode DE2 of the driving transistor TFT2. Accordingly, a composition material of the auxiliary line AL may be the same as that of each of the second source electrode SE2 and the second drain electrode DE2. Similarly, the data line DL may be formed through the same process. After the auxiliary line AL, the data line DL, and the driving transistors TFT2 are formed, a preliminary cover insulating layer L3-0 covering the auxiliary lines AL and the driving transistors TFT2 is formed.

After the preliminary cover insulating layer L3-0 is formed, the first contact hole CH1 and a second via hole VH2 may be formed to create the cover insulating layer L3. As a result, the second drain electrode DE2 is exposed through the second via hole VH2 and a portion of the auxiliary line AL is exposed through the first contact hole CH1.

Figure 7C:
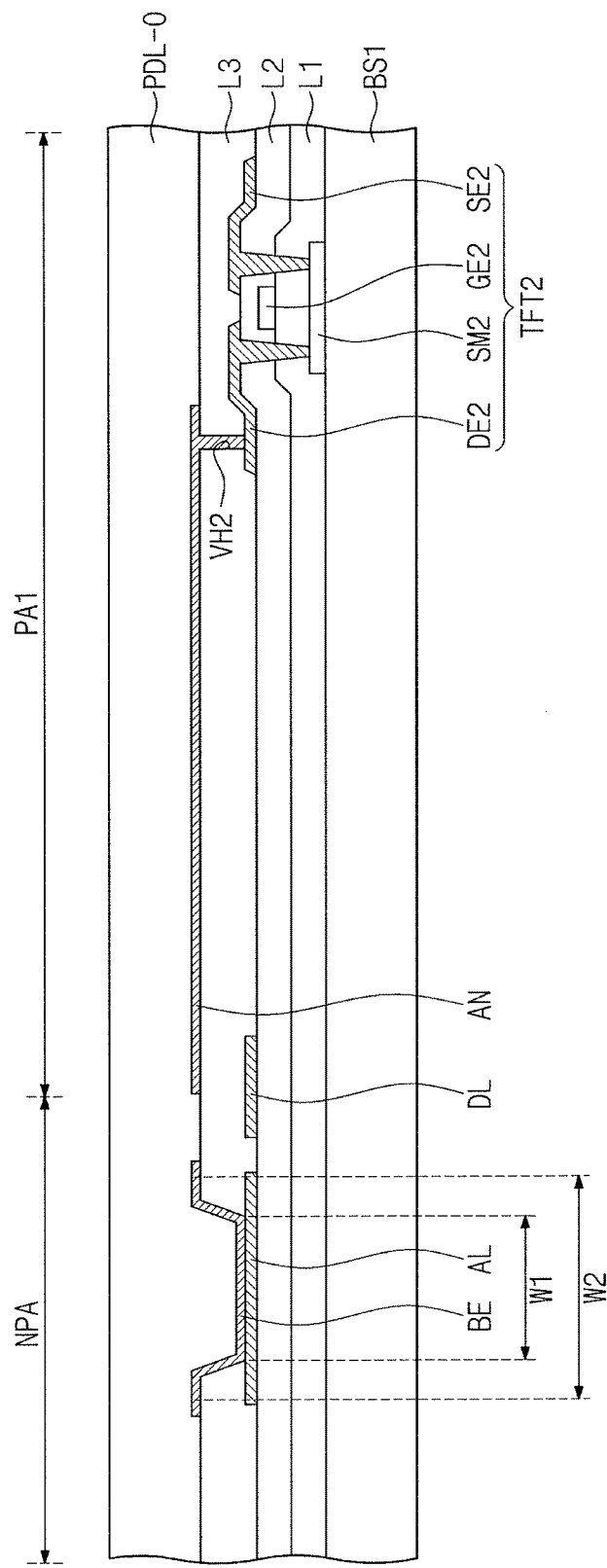
Figure 7D:
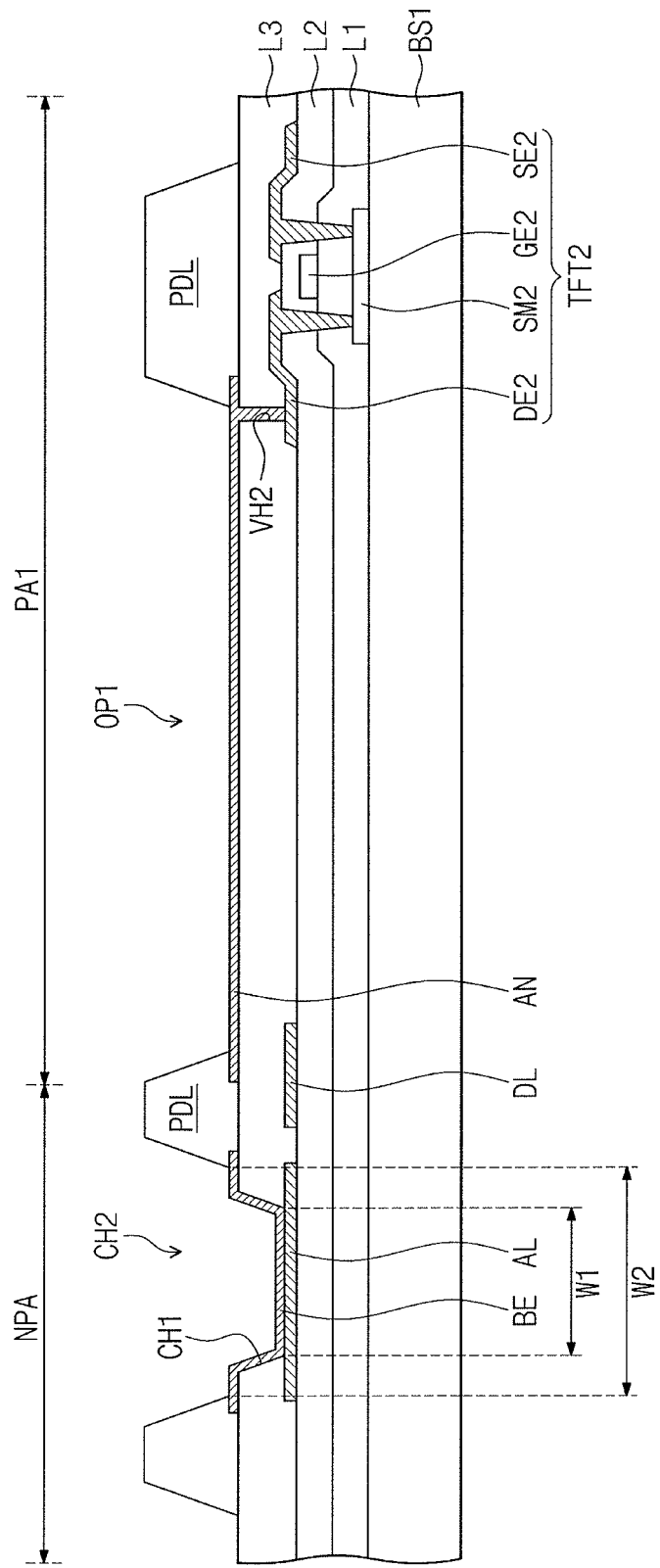

Referring to FIGS. 7C and 7D, after the cover insulating layer L3 is formed, a connecting electrode BE and an anode AN may be formed on the cover insulating layer L3. The connecting electrode BE may be connected to the auxiliary line AL through the first contact hole CH1. Also, the anode AN may be electrically connected to the second drain electrode DE2 through the second via hole VH2.

In the current embodiment, the connecting electrode BE and the anode AN may be formed through the same process. Accordingly, a composition material of the connecting electrode BE may be the same as that of the anode AN.

After the connecting electrode BE and the anode AN are formed, a preliminary pixel defining layer PDL-0 may be formed on the cover insulating layer L3. Subsequently, the first opening OP1 and the second contact hole CH2 may be formed in the preliminary pixel defining layer PDL-0 to create the pixel defining layer PDL.

The first opening OP1 corresponds to the pixel region PA and the second contact hole CH2 overlaps the first contact hole CH1 corresponding to the non-pixel region NPA. As a result, the anode AN may be exposed to the outside through the first opening OP1, and the connecting electrode BE may be exposed to the outside through the first and second contact holes CH1 and CH2.

In the current embodiment, a second width W2 of the second contact hole CH2 may be greater than that of the first contact hole CH1, and when viewed in a plane, the first contact hole CH1 may be located inside the second contact hole CH2. In other words, the connecting electrode BE may have a bottom surface in contact with the auxiliary line AL in the first contact hole CHI and may extend along sidewalls of the first contact hole CH to an upper surface of the cover insulating layer L3, such that a portion of the upper surface of the connecting electrode BE may be exposed by the second contact hole CH2, while a remainder thereof may be covered by the pixel defining layer PDL.

Figure 7E:
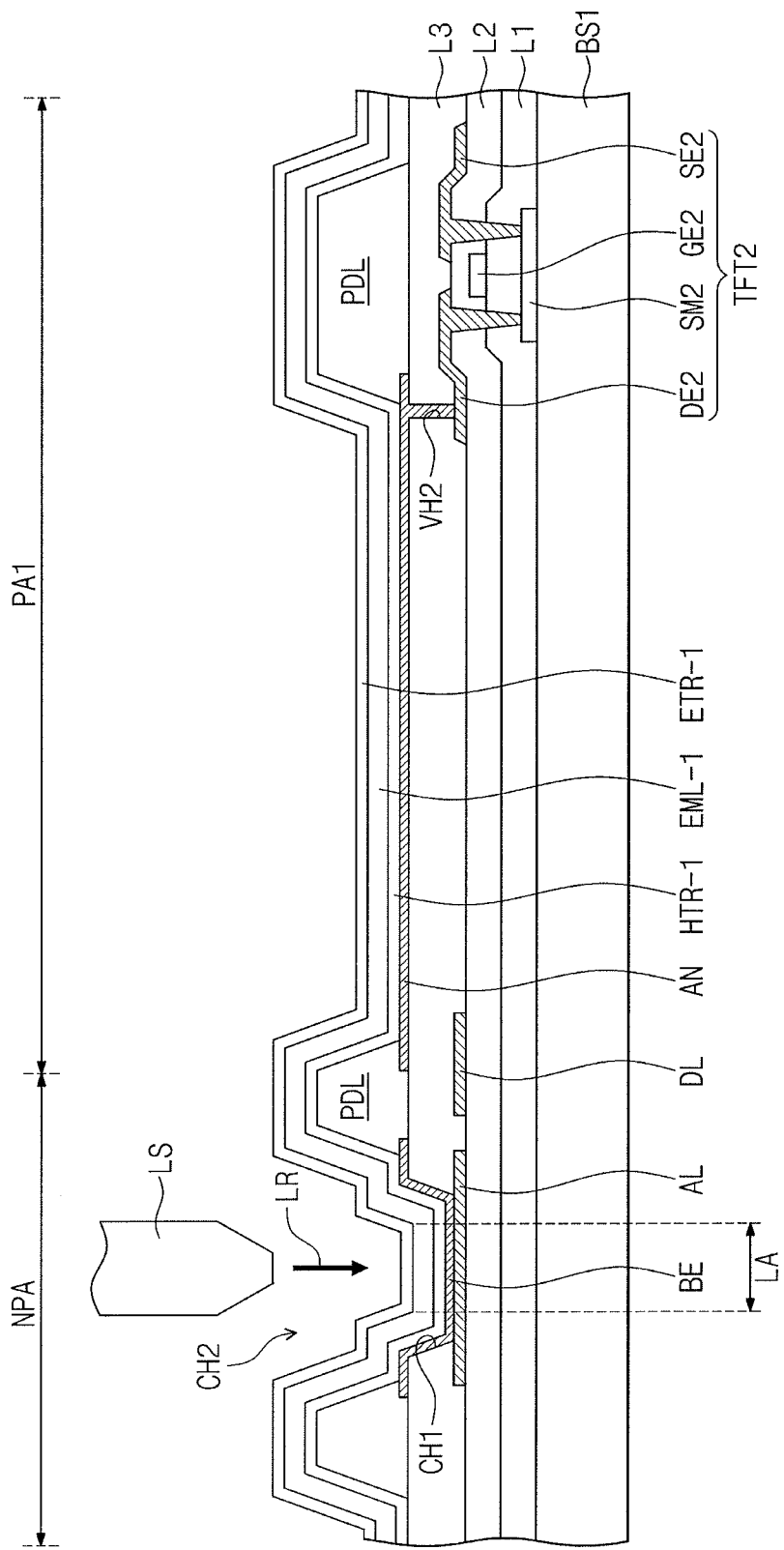
Figure 7F:
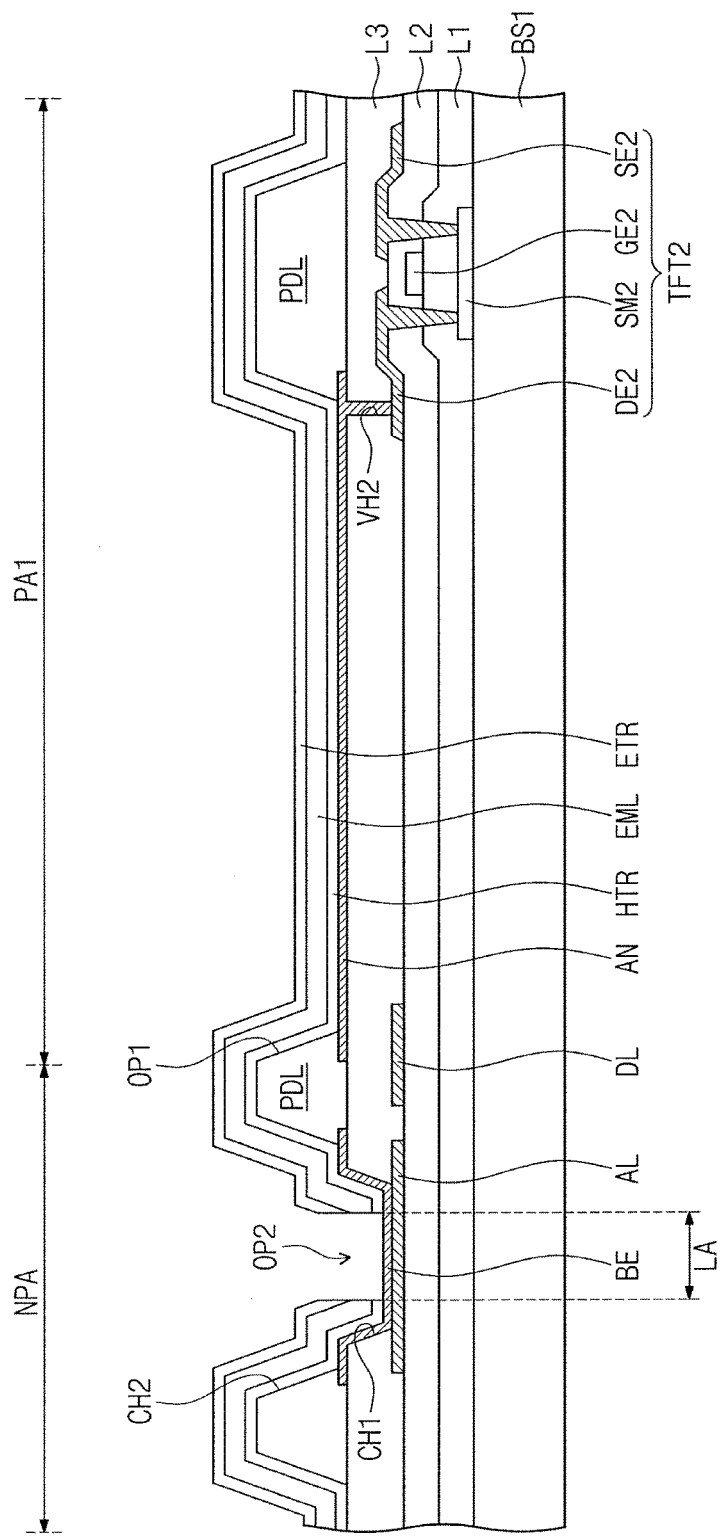

Referring to FIGS. 7E and 7F, after the pixel defining layer PDL is formed, a preliminary hole control layer HTR-1, a preliminary organic light emitting layer EML-1, and a preliminary electron control layer ETR-1 are formed. In the current embodiment, each of the preliminary hole control layer HTR-1, the preliminary organic light emitting layer EML-1, and the preliminary electron control layer ETR-1 may be a single film across the pixel region PA and the non-pixel region NPA.

Subsequently, using a laser irradiation device LS, a portion of each of the preliminary hole control layer HTR-1, the preliminary organic light emitting layer EML-1, and the preliminary electron control layer ETR-1, which corresponds to a laser irradiation region LA, is irradiated with laser LR. As a result, the second opening OP2 is formed corresponding to the laser irradiation layer LA in each of the of the preliminary hole control layer HTR-1, the preliminary organic light emitting layer EML-1, and the preliminary electron control layer ETR-1, and the connecting electrode BE is exposed to the outside through the second opening OP2, the first contact hole CH1, and the second contact hole CH2.

In the current embodiment, when the laser irradiation region LA is irradiated with the laser LR, the connecting electrode BE may be irradiated with a portion of the laser LR, and a portion of the connecting electrode BE may be deformed by the laser LR. However, in the current embodiment, since the connecting electrode BE is brought into contact with the auxiliary line AL in the laser irradiation layer LA and a lower portion of the connecting electrode BE is thereby supported by the auxiliary line AL, the contact between the connecting electrode BE and the auxiliary line AL may be prevented from being unstable.

Figure 7G:
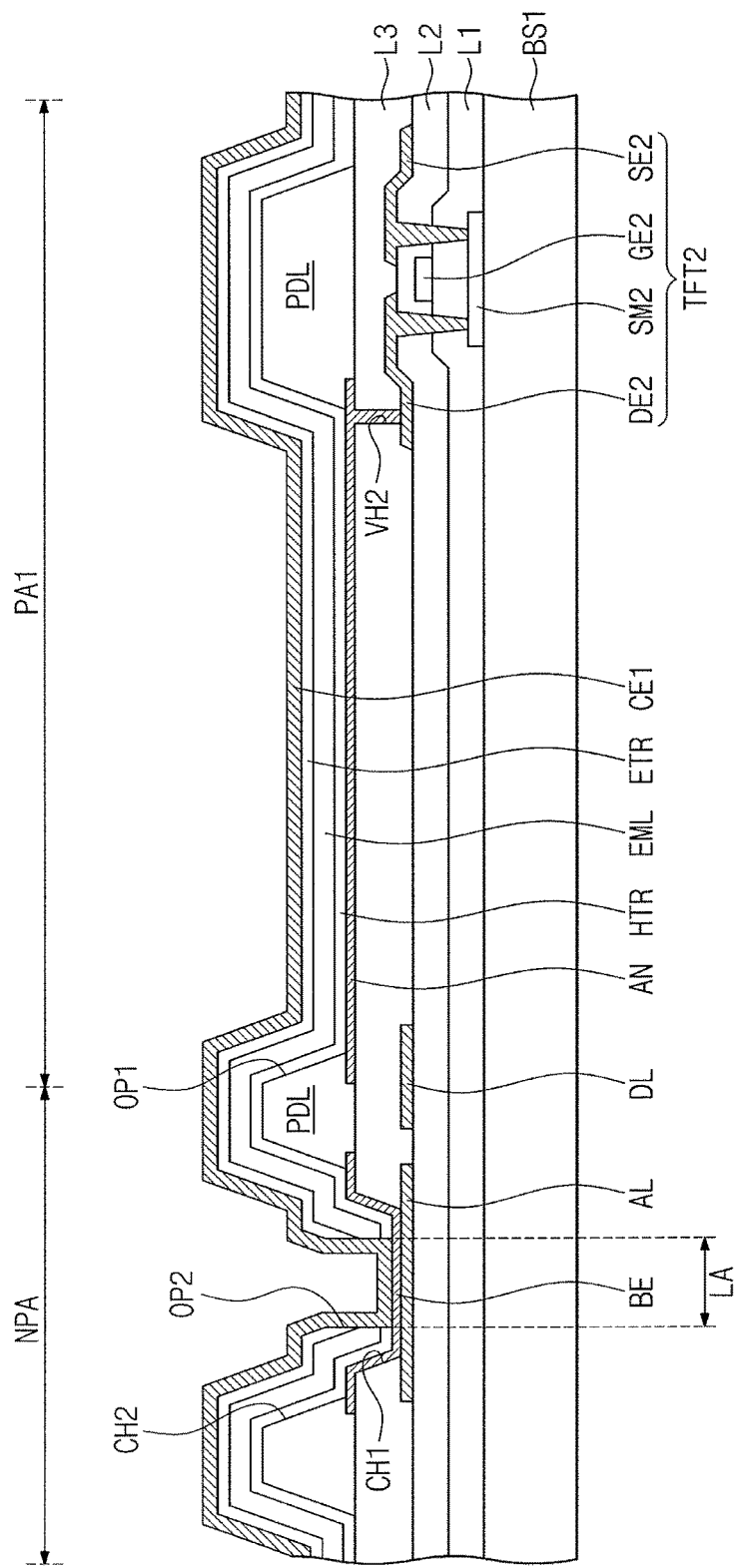
Figure 7H:
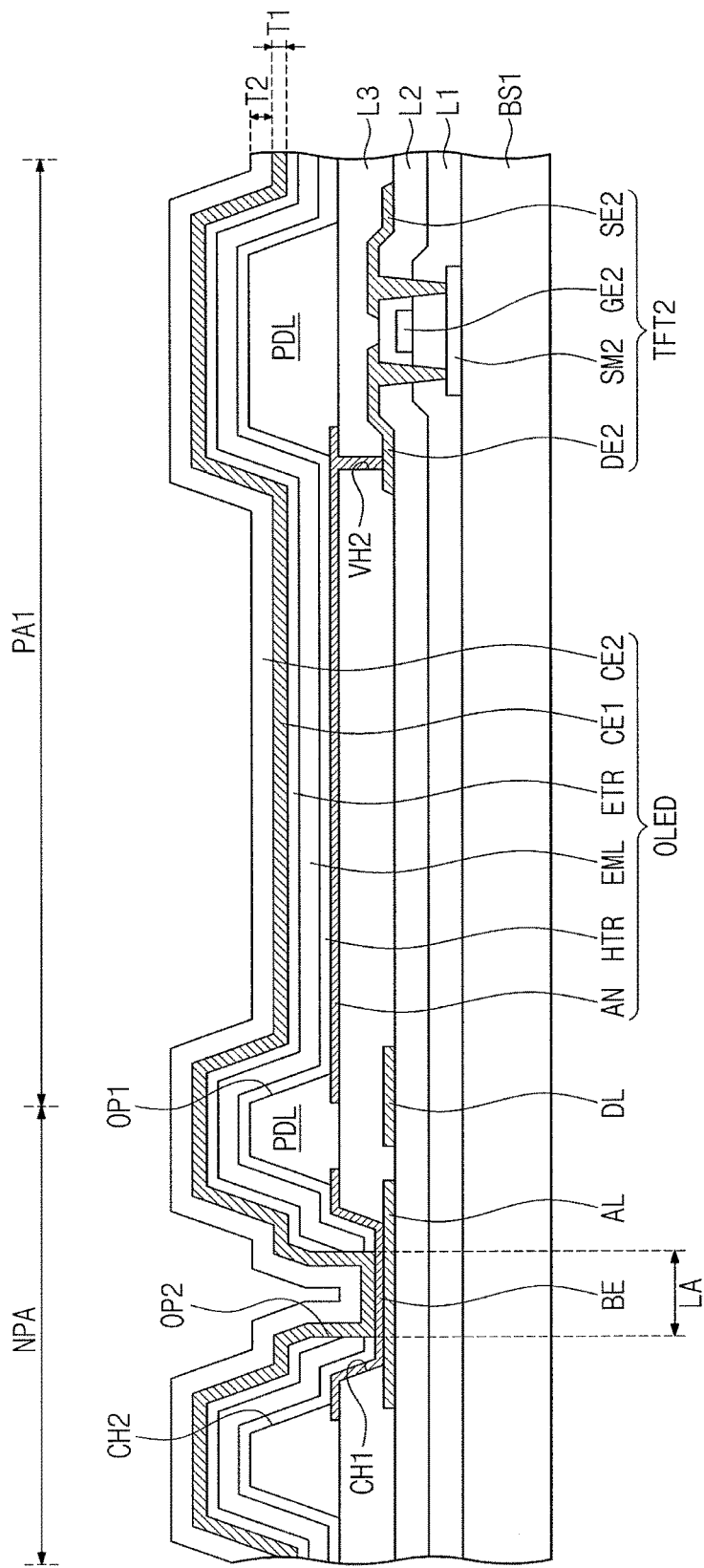

Referring to FIGS. 7G and 7H, after the hole control layer HTR, the organic light emitting layer EML, and the electron control layer ETR in which the second opening OP2 is defined, a first cathode CE1 is formed on the electron control layer ETR. The first cathode CE1 may be electrically connected to the connecting electrode BE which is exposed through the first contact hole CH1, the second contact hole CH2 and the second opening OP2.

Subsequently, a second cathode CE2 is formed on the first cathode CE1 and thus the forming of the organic light emitting element OLED is completed. In the current embodiment, the first cathode CE1 may be formed by using a thermal evaporation method, and the second cathode CE2 may be formed by using a sputtering method. Accordingly, when the second cathode CE2 is formed by the sputtering method, the first cathode CE1 may prevent the organic light emitting layer EML from being damaged by the sputtered particles.

Also in the current embodiment, since the auxiliary line AL, the connecting electrode BE, and the first cathode CE1 are collectively connected to each other through the first and second contact holes CH1 and CH2, a stepped portion approximately corresponding to the sum of the depth of the first contact hole CH1 and the depth of the second contact hole CH2 may be generated in the first cathode CE1. In the current embodiment, even though the stepped portion is generated in the first cathode CE1 and, thus, a crack may be generated in the first cathode CE1, since the first cathode CE1 is covered by the second cathode CE2, the first and second cathodes CE1 and CE2 may be stably connected to the connecting electrodes BE.

Subsequently, the thin encapsulating layer (L4 of FIG. 2B), the light blocking layer (BM of FIG. 2B), and the first color filter (CF1 of FIG. 2B) are formed. Then, the organic light emitting element OLED may be encapsulated by using an encapsulation substrate (BS2 of FIG. 2B), so that the organic light emitting display device is completed.

According to an embodiment, an organic light emitting element includes a first cathode including a metal and a second cathode, on the first cathode, including a transparent conductive oxide. Accordingly, electron injection property of the organic light emitting element may be improved by the first cathode, and light transmitting property may not be deteriorated and electrical resistance may be easily decreased by the second cathode.

Also, when the second cathode is formed through a sputtering method, sputtered particles of the first cathode may be prevented from penetrating into the organic light emitting layer. Thus the organic light emitting layer may be prevented from being damaged by the sputtered particles.

Also, even if a stepped portion approximately corresponding to the sum of the thicknesses of the insulating layers is generated in the first cathode in order to connect the first cathode to the connecting electrode and the auxiliary line, the first cathode is covered by the second cathode, such that coverage of the first and second cathodes may thereby be improved. Thus, the first and second cathodes may be stably connected to the connecting electrode and the auxiliary line. Thus, the present disclosure provides an organic light emitting display device with improved display quality and a method for manufacturing the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
   a base substrate having a pixel region and a non-pixel region;
   an auxiliary line in the non-pixel region;
   a light emitting element in the pixel region, the light emitting element including:
     an anode;
     a first organic light emitting layer on the anode;
     a first cathode on the first organic light emitting layer to be electrically connected to the auxiliary line; and
     a second cathode on the first cathode to be electrically connected to the first cathode, wherein the first cathode includes a metal and the second cathode includes a transparent conductive oxide (TCO);
   a cover insulating layer, between the base substrate and the anode, covering the auxiliary line;
   a pixel defining layer on the cover insulating layer;
   a first contact hole in the cover insulating layer, the first contact hole overlapping the auxiliary line; and
   a second contact hole in the pixel defining layer, the second contact hole overlapping the first contact hole and the auxiliary line, wherein
   the first cathode is electrically connected to the auxiliary line through the first and second contact holes.

2. The organic light emitting display device as claimed in claim 1, wherein a thickness of the second cathode is greater than that of the first cathode.

3. The organic light emitting display device as claimed in claim 1, further comprising:
   a driving transistor between the base substrate and the anode; and a via hole overlapping the anode, wherein:
the cover insulating layer covers the driving transistor, and
the pixel defining layer exposes the anode, wherein
the light emitting element is electrically connected to the driving transistor through the via hole.

4. The organic light emitting display device as claimed in claim 3, wherein a width of the second contact hole is greater than that of the first contact hole, and when viewed in a plane, the first contact hole is located inside the second contact hole.

5. The organic light emitting display device as claimed in claim 3, further comprising a connecting electrode in the first contact hole that electrically connects the auxiliary line to the first cathode.

6. The organic light emitting display device as claimed in claim 5, wherein the connecting electrode is between the auxiliary line and the first cathode and contacts with the auxiliary line and the first cathode.

7. The organic light emitting display device as claimed in claim 5, wherein the driving transistor includes:
a semiconductor pattern;
a control electrode overlapping the semiconductor pattern;
an input electrode connected to the semiconductor pattern; and
an output electrode connected to the anode, wherein
a composition material of the auxiliary line is the same as that of the input electrode or the control electrode, and
a composition material of the connecting electrode is the same as that of the anode.

8. The organic light emitting display device as claimed in claim 3, wherein the light emitting element further includes:
a hole control layer between the anode and the first organic light emitting layer; and
an electron control layer between the first cathode and the first organic light emitting layer, wherein:
each of the organic light emitting layer, the hole control layer, and the electron control layer is a continuous film over the pixel region and the non-pixel region including the auxiliary line;
an opening overlapping the first contact hole and the second contact hole is defined in a portion of each of the organic light emitting layer, the hole control layer and the electron control layer which correspond to the non-pixel region in which the auxiliary line is formed; and
the first cathode is connected to the auxiliary line through the first contact hole.

9. The organic light emitting display device as claimed in claim 1, further comprising a color filter overlapping the light emitting element corresponding to the pixel region, wherein the first organic light emitting layer emits white light.

10. The organic light emitting display device as claimed in claim 1, wherein the light emitting element further includes a second organic light emitting layer on the first organic light emitting layer between the anode and the first cathode, wherein a wavelength of light emitted from the first organic light emitting layer is different from that of light emitted from the second organic light emitting layer.

11. The organic light emitting display device as claimed in claim 10, wherein the light emitting element further includes an electric charge generating layer between the first and second organic light emitting layer.

12. The organic light emitting display device as claimed in claim 10, wherein the second organic light emitting layer is in contact with the first organic light emitting layer.

13. A method for manufacturing an organic light emitting display device, the method comprising:
forming an auxiliary line in a non-pixel region of a base substrate;
forming an organic light emitting element in a pixel region of the base substrate, forming the organic light emitting element including:
forming an anode on the base substrate;
forming an organic light emitting layer on the anode;
forming a first cathode including a metal and electrically connected to the auxiliary line on the organic light emitting layer; and
forming a second cathode including a transparent conductive oxide and electrically connected to the first cathode on the first cathode;
forming a cover insulating layer, the covering insulating layer between the base substrate and covering the auxiliary line; and
forming a pixel defining layer on the cover insulating layer, wherein
forming the cover insulating layer includes forming a first contact hole in the cover insulating layer, the first contact hole overlapping the auxiliary line, and
forming the pixel defining layer includes a second contact hole in the pixel defining layer, the second contact hole overlapping the first contact hole and the auxiliary line, wherein
the first cathode is electrically connected to the auxiliary line through the first and second contact holes.

14. The method as claimed in claim 13, wherein
forming the cover insulating layer includes:
forming a preliminary cover insulating layer configured to cover the auxiliary line; and
forming the first contact hole in the preliminary cover insulating layer to expose a portion of the auxiliary line, and
forming the pixel defining layer includes:
forming a preliminary pixel defining layer configured to cover the auxiliary line and the anode; and
forming a first opening in the preliminary pixel defining layer to expose a portion of the anode and to form the second contact hole overlapping the first contact hole.

15. The method as claimed in claim 14, further comprising forming a connecting electrode electrically connected to the auxiliary line through the first contact hole between forming the cover insulating layer and forming the pixel defining layer, wherein the first cathode is electrically connected to the auxiliary line through the connecting electrode.

16. The method as claimed in claim 15, wherein the connecting electrode and the anode are formed through a same process.

17. The method as claimed in claim 14, wherein forming the organic light emitting layer includes:
forming a preliminary organic light emitting layer on the anode and the auxiliary line; and
forming a second opening overlapping the first and second contact holes on the preliminary organic light emitting layer by irradiating the preliminary organic light emitting layer with laser, wherein
the first cathode is electrically connected to the auxiliary line through the first contact hole, the second contact hole, and the second opening.

18. The method as claimed in claim 13, wherein the first cathode is formed through a thermal evaporation method, and the second cathode is formed through a sputtering method.

19. An organic light emitting display device, comprising:
a base substrate having a pixel region and a non-pixel region;
an auxiliary line in the non-pixel region; and
a light emitting element in the pixel region, the light emitting element including:
a first electrode;
an organic light emitting layer on the first electrode;
a second electrode on the organic light emitting layer to be electrically connected to the auxiliary line; and
a third electrode on the second electrode to be electrically connected to the second electrode, the second and third electrodes including different materials to each other, wherein one of the second and third electrodes includes a transparent conductive oxide);
a cover insulating layer, between the base substrate and the first electrode, covering the auxiliary line;
a pixel defining layer on the cover insulating layer;
a first contact hole in the cover insulating layer, the first contact hole overlapping the auxiliary line; and
a second contact hole in the pixel defining layer, the second contact hole overlapping the first contact hole and the auxiliary line, wherein
the second electrode is electrically connected to the auxiliary line through the first and second contact holes.

20. The organic light emitting display device as claimed in claim 19, wherein the third electrode includes the transparent conductive oxide and the second electrode includes a metal.

* * * * *